(12) United States Patent
Chuang et al.

(10) Patent No.: US 9,177,870 B2
(45) Date of Patent: Nov. 3, 2015

(54) ENHANCED GATE REPLACEMENT PROCESS FOR HIGH-K METAL GATE TECHNOLOGY

(75) Inventors: Hak-Lay Chuang, Hsinchu (TW); Ming Zhu, Singapore (SG)

(73) Assignee: Taiwan Semiconductor Manufacturing Company Ltd., Hsin-Chu (TW)

(*) Notice: Subject to any disclaimer, the term of this patent is extended or adjusted under 35 U.S.C. 154(b) by 223 days.

(21) Appl. No.: 13/328,382

(22) Filed: Dec. 16, 2011

(65) Prior Publication Data

US 2013/0154021 A1    Jun. 20, 2013

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 21/8238* (2006.01)

(52) U.S. Cl.
CPC ... *H01L 21/823842* (2013.01); *H01L 21/823857* (2013.01)

(58) Field of Classification Search
CPC ............ H01L 21/823842; H01L 29/517; H01L 21/823857; H01L 29/4966; H01L 27/092
USPC ............ 257/351, 369, E21.19, E27.062, 257/E21.632
See application file for complete search history.

(56) References Cited

U.S. PATENT DOCUMENTS

| | | | |
|---|---|---|---|
| 7,176,531 B1* | 2/2007 | Xiang et al. | 257/369 |
| 2009/0152636 A1* | 6/2009 | Chudzik et al. | 257/369 |
| 2010/0041223 A1* | 2/2010 | Chen et al. | 438/591 |
| 2010/0048013 A1* | 2/2010 | Thei et al. | 438/591 |
| 2010/0109095 A1* | 5/2010 | Li et al. | 257/392 |

OTHER PUBLICATIONS

Chinese Office Action issued May 21, 2015 in CN Patent Application No. 101122588 filed Sep. 17, 2007.

* cited by examiner

*Primary Examiner* — Thien F Tran
(74) *Attorney, Agent, or Firm* — Haynes and Boone, LLP

(57) ABSTRACT

The present disclosure provides a method of fabricating a semiconductor device. A high-k dielectric layer is formed over a substrate. A first capping layer is formed over a portion of the high-k dielectric layer. A second capping layer is formed over the first capping layer and the high-k dielectric layer. A dummy gate electrode layer is formed over the second capping layer. The dummy gate electrode layer, the second capping layer, the first capping layer, and the high-k dielectric layer are patterned to form an NMOS gate and a PMOS gate. The NMOS gate includes the first capping layer, and the PMOS gate is free of the first capping layer. The dummy gate electrode layer of the PMOS gate is removed, thereby exposing the second capping layer of the PMOS gate. The second capping layer of the PMOS gate is transformed into a third capping layer.

20 Claims, 15 Drawing Sheets

ENHANCED GATE REPLACEMENT PROCESS FOR HIGH-K METAL GATE TECHNOLOGY

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To enhance the performance of ICs, metal gate transistors have been used in recent years. However, conventional methods of forming metal gate transistors may be complex and expensive. For example, the NMOS and PMOS gates may require their own formation processes, which not only increase fabrication costs due to the added complexity, but may also lead to potential process defects and uniformity issues.

Therefore, while existing methods of fabricating metal gate transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
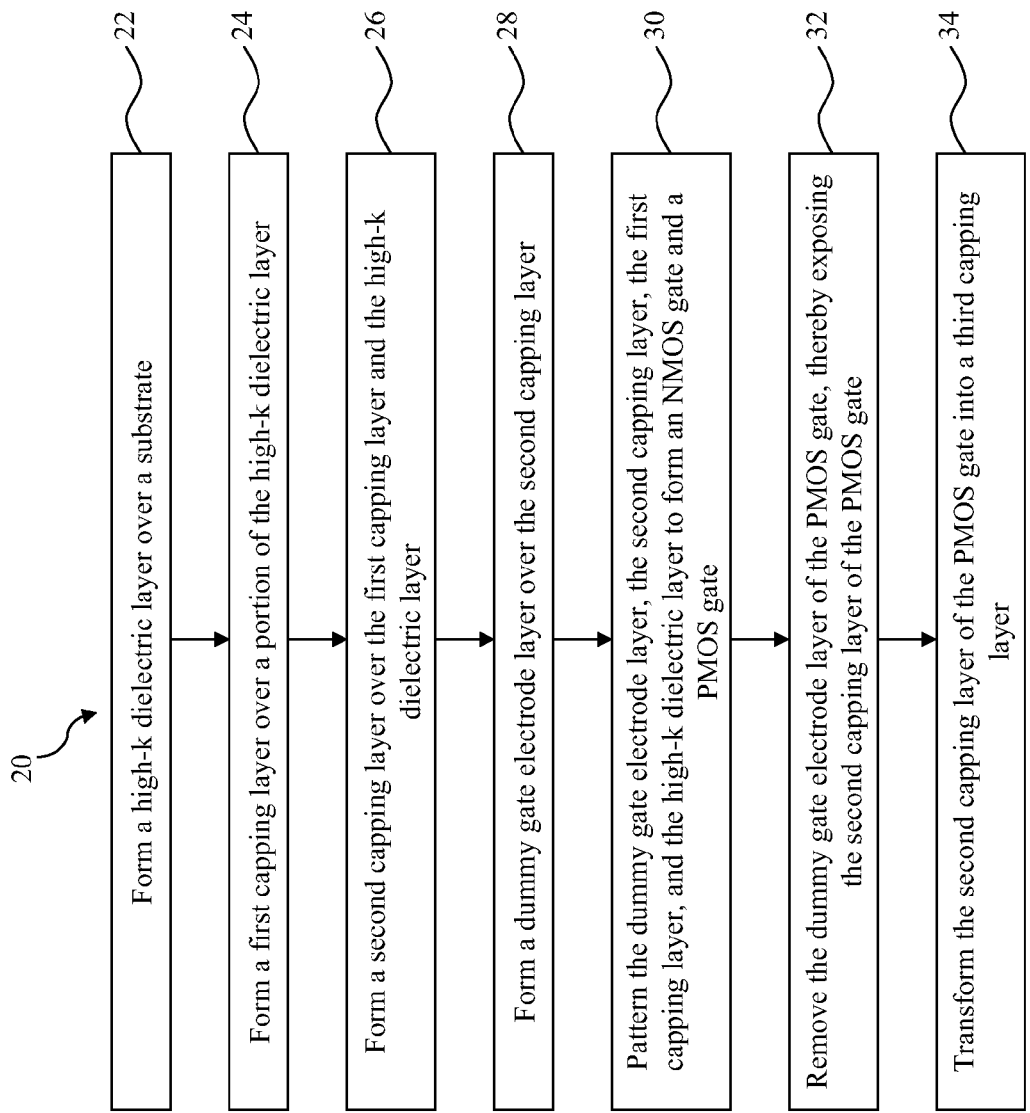
FIG. 1 is a flowchart illustrating a method of fabricating a semiconductor device according to various aspects of the present disclosure.

One of the broader forms of the present disclosure involves a semiconductor device. The semiconductor device includes: a substrate; an NMOS gate disposed over the substrate, wherein the NMOS gate includes: a high-k gate dielectric, a first capping layer disposed over the high-k gate dielectric, and a second capping layer disposed over the first capping layer, and wherein the first and second capping layers are configured to collectively tune a work function of the NMOS gate; and a PMOS gate disposed over the substrate, wherein the PMOS gate includes: a high-k gate dielectric, and a third capping layer disposed over the high-k gate dielectric, and wherein the third capping layer is configured to tune a work function of the PMOS gate.

In some embodiments, the third capping layer is an oxidized version of the second capping layer.

In some embodiments, the second capping layer includes titanium nitride; and the third capping layer includes titanium oxynitride.

In some embodiments, the first capping layer includes lanthanum oxide.

In some embodiments, the high-k gate dielectric has a dielectric constant greater than that of silicon dioxide.

In some embodiments, the NMOS gate and the PMOS gate each include a metal gate electrode.

In some embodiments, the metal gate electrode includes a work function metal layer disposed over the second and third capping layers.

Another one of the broader forms of the present disclosure involves a semiconductor structure. The semiconductor structure includes: an nFET transistor and a pFET transistor, wherein: the nFET transistor includes: a high-k gate dielectric layer; and an nFET work function layer formed over the high-k gate dielectric layer, the nFET work function layer including a metal oxide component and a metal nitride component; and the pFET transistor includes: a high-k gate dielectric layer; and an pFET work function layer formed over the high-k gate dielectric layer, the pFET work function layer including a metal oxynitride component.

In some embodiments, the metal oxide component contains lanthanum oxide.

In some embodiments, the metal nitride component includes titanium nitride.

In some embodiments, the metal oxynitride component includes titanium oxynitride.

In some embodiments, the high-k gate dielectric layer has a dielectric constant greater than that of silicon dioxide; and the nFET transistor and the pFET transistor include a metal gate electrode formed over the nFET work function layer and the pFET work function layer, respectively.

In some embodiments, the metal gate electrode of the nFET and pFET transistors includes an additional work functional metal layer formed over the nFET work function layer and the pFET work function layer.

Another one of the broader forms of the present disclosure involves a method of fabricating a semiconductor device. The method includes: forming a high-k dielectric layer over a substrate; forming a first capping layer over a portion of the high-k dielectric layer; forming a second capping layer over the first capping layer and the high-k dielectric layer; forming a dummy gate electrode layer over the second capping layer; patterning the dummy gate electrode layer, the second capping layer, the first capping layer, and the high-k dielectric layer to form an NMOS gate and a PMOS gate, wherein the NMOS gate includes the first capping layer, and the PMOS gate is free of the first capping layer; removing the dummy gate electrode layer of the PMOS gate, thereby exposing the second capping layer of the PMOS gate; and transforming the second capping layer of the PMOS gate into a third capping layer.

In some embodiments, the first capping layer includes lanthanum oxide.

In some embodiments, the second capping layer includes titanium nitride.

In some embodiments, the third capping layer includes titanium oxynitride.

In some embodiments, the transforming includes performing an oxygen treatment process to the second capping layer of the PMOS gate.

In some embodiments, the method further includes, after the transforming: removing the dummy gate electrode layer of the NMOS gate; forming a conductive material over the second capping layer of the NMOS gate and the third capping layer of the PMOS gate; and performing a polishing process to the conductive material.

In some embodiments, the high-k gate dielectric has a dielectric constant greater than that of silicon dioxide; and the dummy gate electrode layer contains polysilicon.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for fabricating a semiconductor device. FIGS. 2-9 are diagrammatic fragmentary cross-sectional side views, of the semiconductor device during various fabrication stages. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-9 have been simplified for a better understanding of the inventive concepts of the present disclosure. Accordingly, it should be noted that additional processes may be provided before, during, and after the method 20 of FIG. 1, and that some other processes may only be briefly described herein.

Referring to FIG. 1, the method 20 includes block 22 in which a high-k dielectric layer is formed over a substrate. The method 20 includes block 24 in which a first capping layer is formed over a portion of the high-k dielectric layer. In some embodiments, the first capping layer includes lanthanum oxide. The method 20 includes block 26 in which a second capping layer is formed over the first capping layer and the high-k dielectric layer. In some embodiments, the second capping layer includes titanium nitride. The method 20 includes block 28 in which a dummy gate electrode layer is formed over the second capping layer. In some embodiments, the dummy gate electrode layer includes polysilicon. The method 20 includes block 30 in which the dummy gate electrode layer, the second capping layer, the first capping layer, and the high-k dielectric layer are patterned to form an NMOS gate and a PMOS gate. The NMOS gate includes the first capping layer, and the PMOS gate is free of the first capping layer. The method 20 includes block 32 in which the dummy gate electrode layer of the PMOS gate is removed, thereby exposing the second capping layer of the PMOS gate. The method 20 includes block 34 in which the second capping layer of the PMOS gate is transformed into a third capping layer. In some embodiments, the transformation includes an oxygen process, and the third capping layer includes titanium oxynitride.

Figure 2:
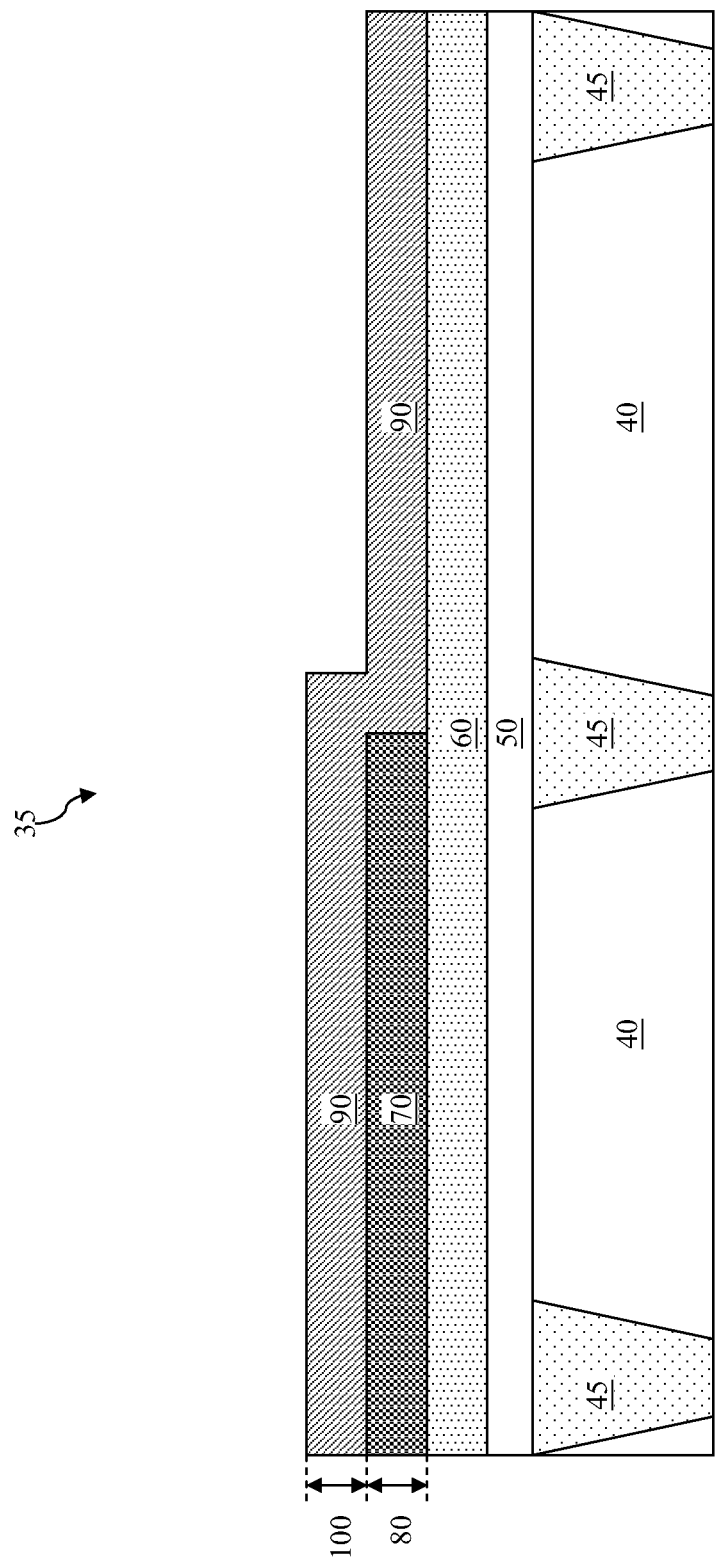
FIGS. 2 to 9 illustrate cross-sectional views of the semiconductor device at various stages of fabrication according to the method of FIG. 1.

Referring to FIG. 2, a semiconductor device 35 is fabricated in accordance with the method 20 of FIG. 1. The semiconductor device 35 has a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Referring back to FIG. 2, shallow trench isolation (STI) features 45 are formed in the substrate 40. The STI features 45 are formed by etching recesses (or trenches) in the substrate 45 and filling the recesses with a dielectric material. In the present embodiment, the dielectric material of the STI features 45 includes silicon oxide. In alternative embodiments, the dielectric material of the STI features 45 may include silicon nitride, silicon oxy-nitride, fluoride-doped silicate (FSG), and/or a low-k dielectric material known in the art. In other embodiments, deep trench isolation (DTI) features may be formed in place of, or in combination with, the STI features 45.

Thereafter, an interfacial layer 50 is optionally formed over the substrate 40. The interfacial layer 50 is formed by an atomic layer deposition (ALD) process and includes silicon oxide ($SiO_2$).

A gate dielectric layer 60 is then formed over the interfacial layer 50. The gate dielectric layer 60 is formed by an ALD process. The gate dielectric layer 60 includes a high-k dielectric material. A high-k dielectric material is a material having a dielectric constant that is greater than a dielectric constant of $SiO_2$, which is approximately 4. In an embodiment, the gate dielectric layer 60 includes hafnium oxide ($HfO_2$), which has a dielectric constant that is in a range from approximately 18 to approximately 40. In alternative embodiments, the gate dielectric layer 60 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO.

A capping layer 70 is formed over a portion of the gate dielectric layer 60. The formation of the capping layer 70 includes one or more deposition and patterning processes. In some embodiments, the capping layer 70 includes a lanthanum oxide material ($LaO_x$, where x is an integer). The capping layer 70 is formed over a region of the substrate 40 reserved for the formation of an NMOS transistor. The $LaO_x$ material of the capping layer helps tune a work function of the gate for the NMOS transistor. Suitable materials for the capping layer 70 can be rare earth oxides such as LaOx, GdOx, DyOx, or ErOx. The capping layer 70 has a thickness 80. In some embodiments, the thickness 80 is in a range from about 5 Angstroms to about 20 Angstroms.

A capping layer 90 is formed over the capping layer 70 and the gate dielectric layer 60. In some embodiments, the capping layer 90 includes a titanium nitride (TiN) material. The portion of the capping layer 90 formed over the capping layer 70 work in conjunction with the capping layer 70 to tune the work function of the gate for the NMOS transistor. The capping layer 90 also serves as an etching-stop layer for a later process. In addition, the capping layer 90 may prevent undesirable metal diffusion. The capping layer 90 has a thickness 100. In some embodiments, the thickness 100 is in a range from about 10 Angstroms to about 50 Angstroms.

Figure 3:
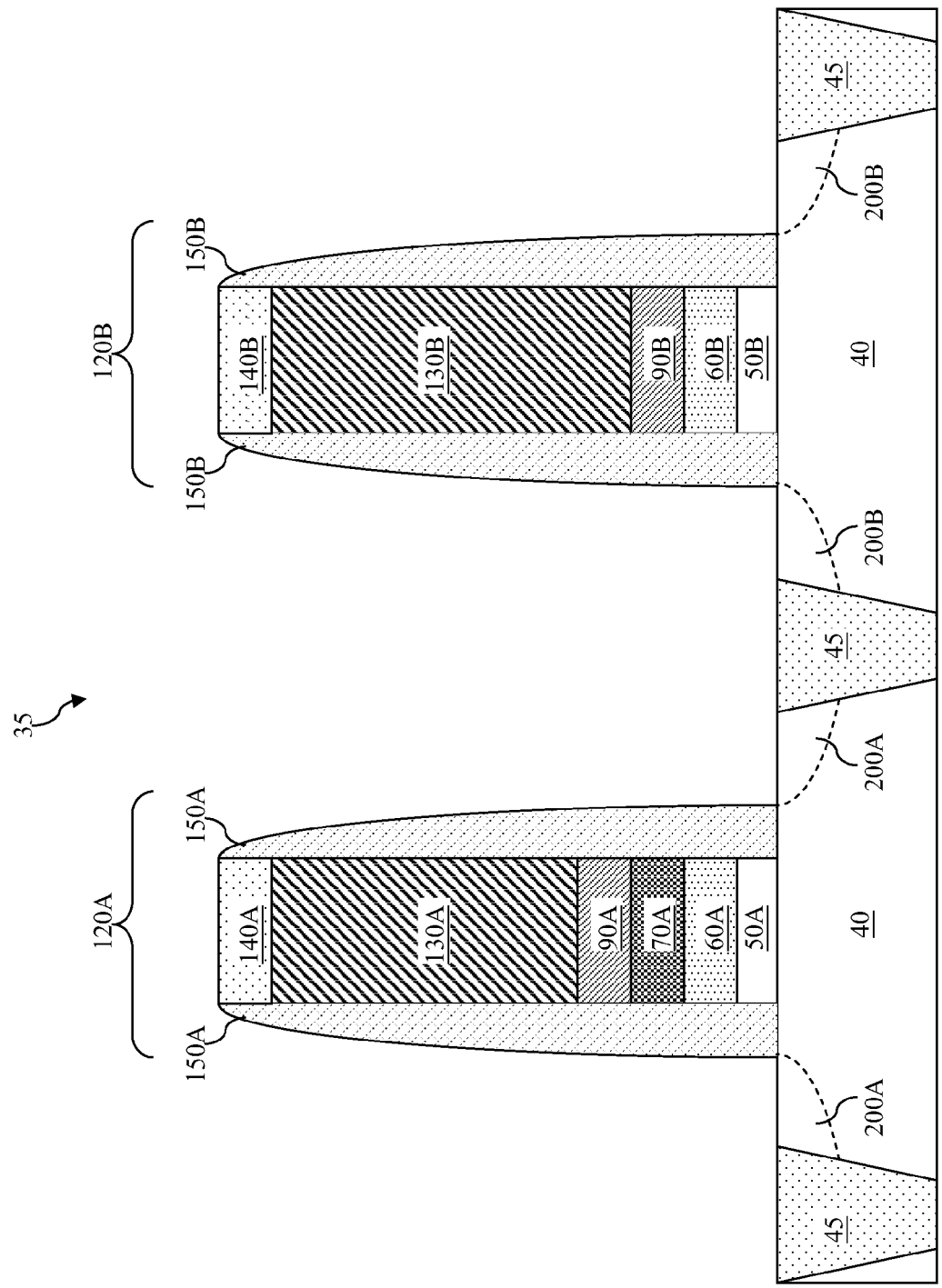

Referring to FIG. 3, gate structures 120A-120B are formed. The gate structure 120A is formed over an NMOS region of the substrate 40, and the gate structure 120B is formed over a PMOS region of the substrate 40. Thus, the gate structure 120A is an NMOS gate, and the gate structure 120B is a PMOS gate. The gate structures 120A-120B include gate electrodes 130A and 130B, hard masks 140A and 140B, and spacers 150A and 150B, respectively. The formation of the gate structures 120A-120B may include depositing a gate electrode layer 130 and thereafter patterning the gate electrode layer 130 and the layers therebelow with patterned hard masks 140A and 140B.

The gate electrodes 130A-130B are dummy gate electrodes. In some embodiments, the gate electrodes 130A-130B include a polysilicon material. The hard masks 140A-140B include a dielectric material, such as silicon oxide or silicon nitride. The gate spacers 150A-150A include a dielectric material. In some embodiments, the gate spacers 150A-150B include silicon nitride. In alternative embodiments, the gate spacers 150A-150B may include silicon oxide, silicon carbide, silicon oxy-nitride, or combinations thereof.

Thereafter, heavily doped source and drain regions 200A and 200B (also referred to as S/D regions) are formed in the NMOS and PMOS portions of the substrate 40, respectively. The S/D regions 200A-200B may be formed by an ion implantation process or a diffusion process known in the art. N-type dopants such as phosphorus or arsenic may be used to form the NMOS S/D regions 200A, and P-type dopants such as boron may be used to form the PMOS S/D regions 200B. As is illustrated in FIG. 3, the S/D regions 200A-200B are aligned with the outer boundaries of the gate spacers 150A-150B, respectively. Since no photolithography process is required to define the area or the boundaries of the S/D regions 200A-200B, it may be said that the S/D regions 200A-200B are formed in a "self-aligning" manner. One or more annealing processes are performed on the semiconductor device 35 to activate the S/D regions 200A-200B. It is also understood that in some embodiments, lightly-doped source/drain (LDD) regions may be formed in both the NMOS and PMOS regions of the substrate before the gate spacers are formed. For reasons of simplicity, the LDD regions are not specifically illustrated herein.

Figure 4:
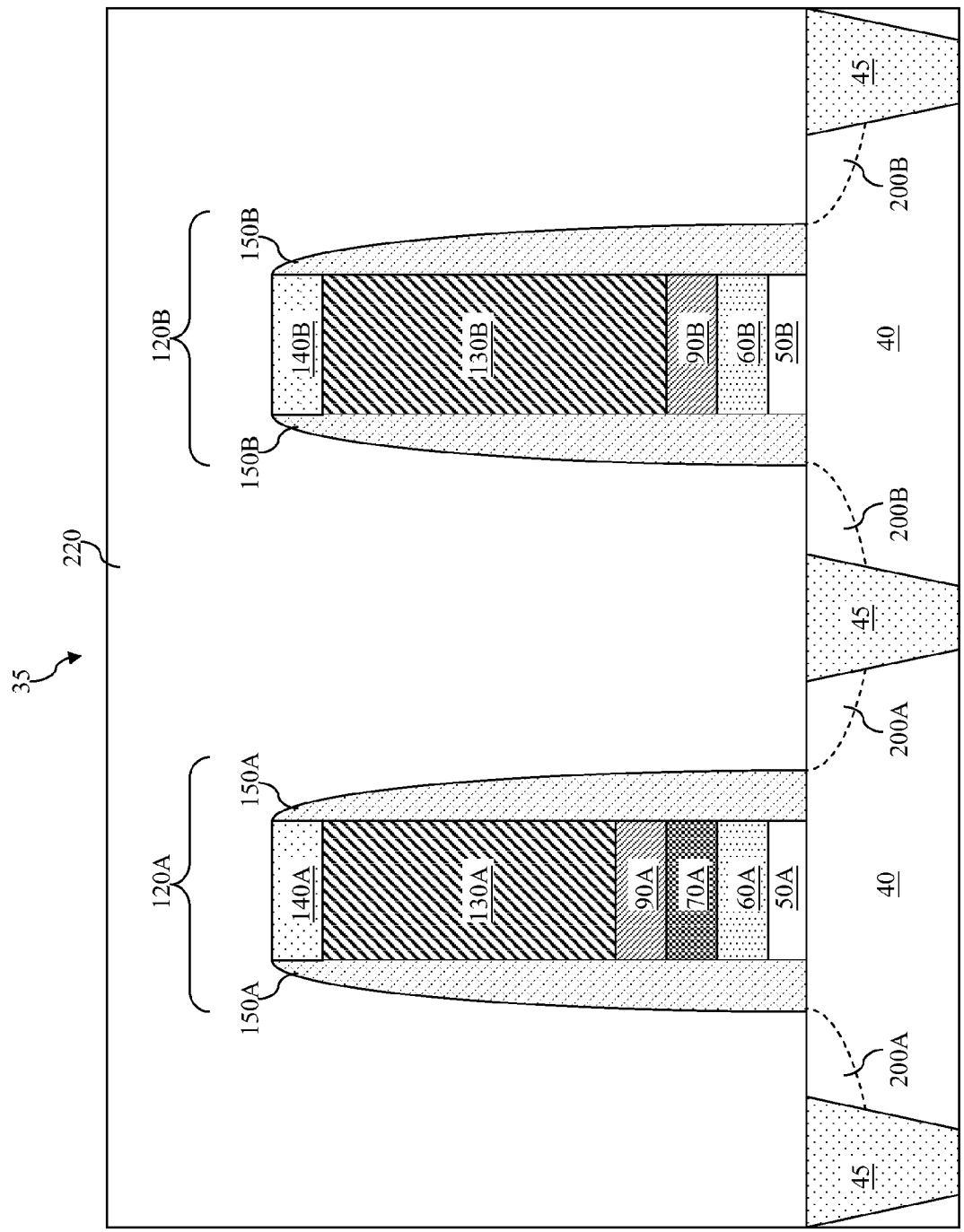

Referring now to FIG. 4, an inter-layer (or inter-level) dielectric (ILD) layer 220 is formed over the substrate 40 and the gate structure 220. The ILD layer 220 may be formed by chemical vapor deposition (CVD), high density plasma CVD, spin-on, sputtering, or other suitable methods. In an embodiment, the ILD layer 220 includes silicon oxide. In other embodiments, the ILD layer 220 may include silicon oxy-nitride, silicon nitride, or a low-k material.

Figure 5A:
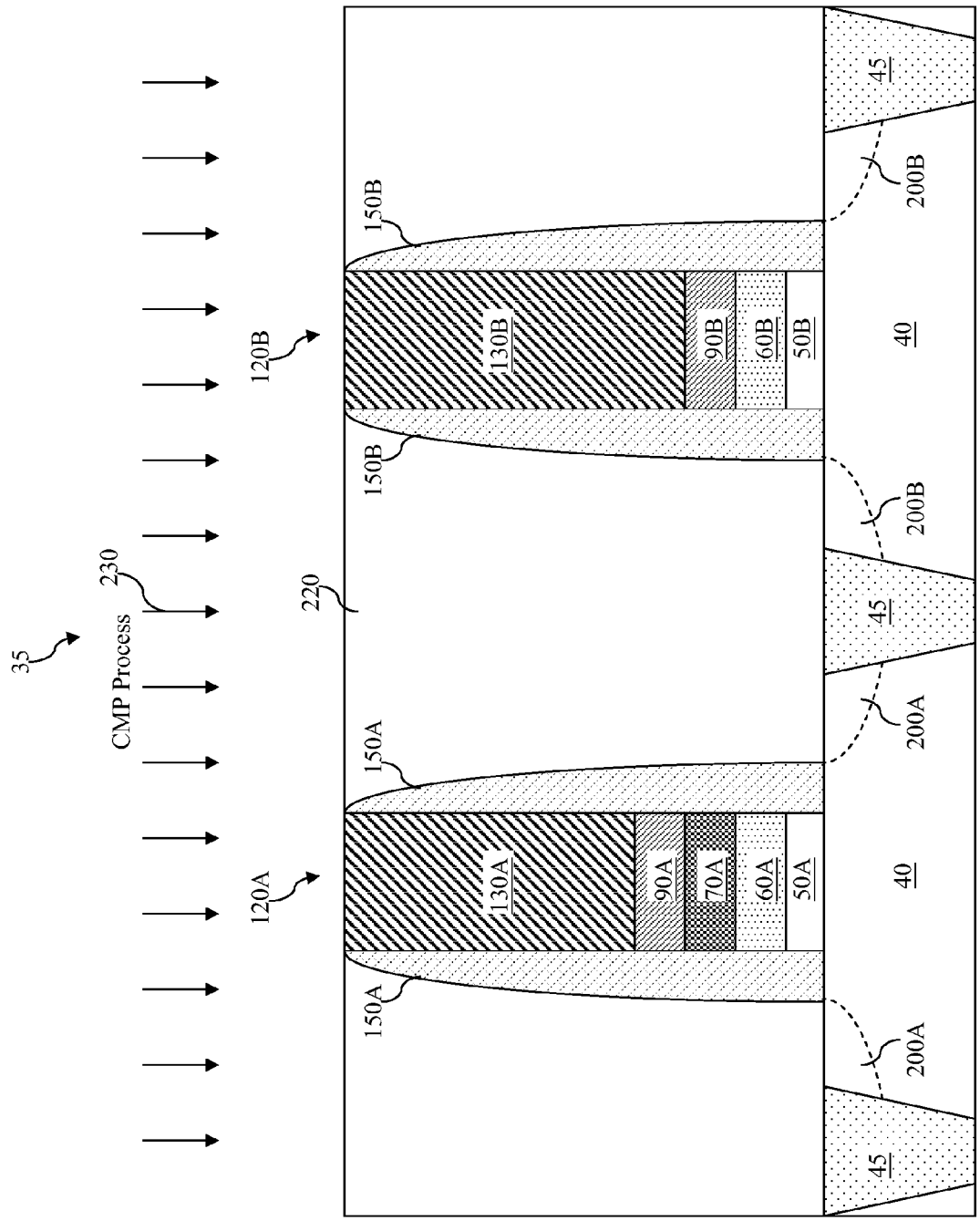

Referring to FIG. 5A, a chemical-mechanical-polishing (CMP) process 230 is performed on the ILD layer 220 to expose a top surface of the dummy gate electrodes of gate structures 120A-120B. The hard masks 140A-140B are removed by the CMP process 230. Following the CMP process 230, the top surface of the gate structures 120A-120B are substantially co-planar with the top surface of the ILD layer 220 on either side of the gate structures 120A-120B.

Figure 5B:
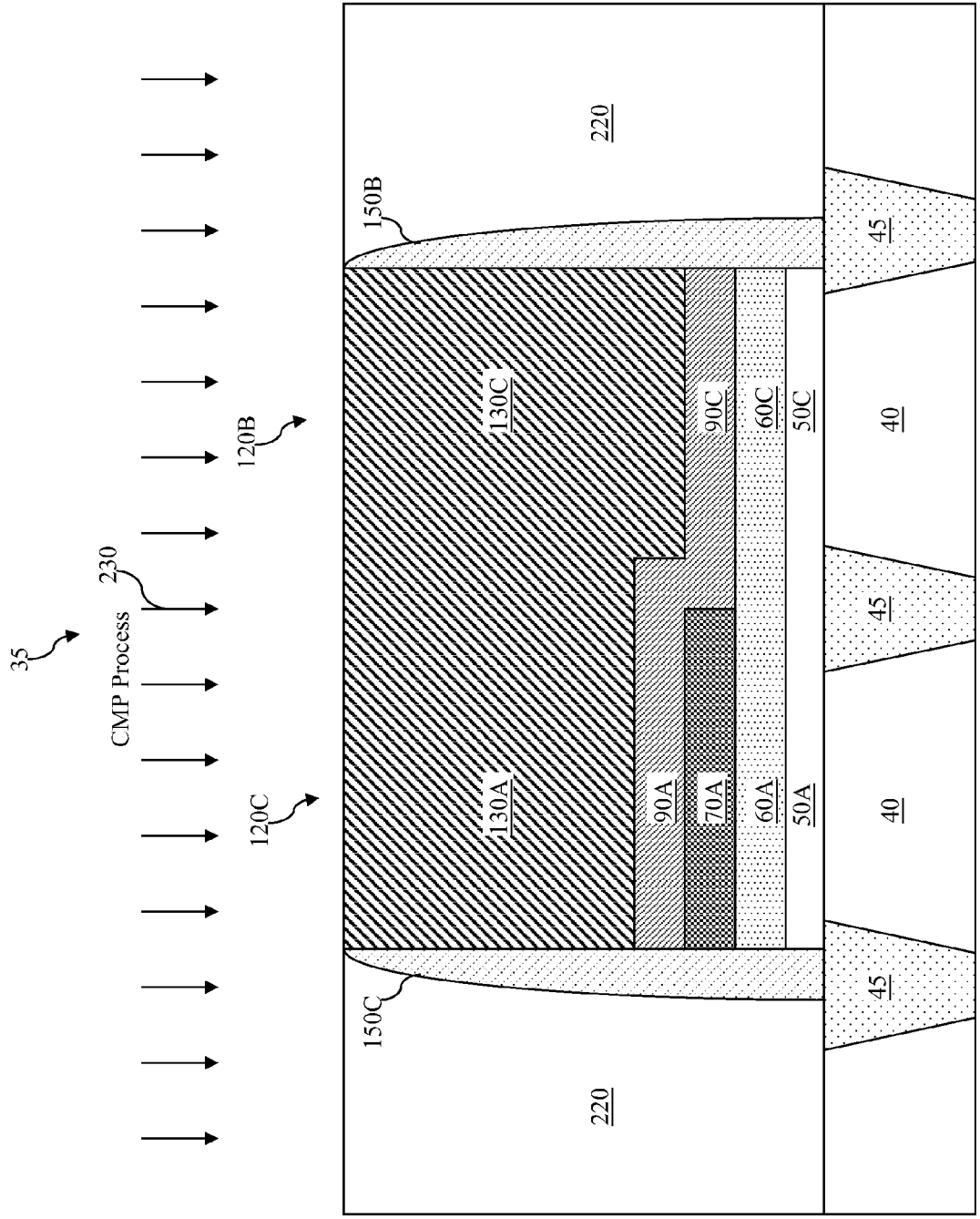
Figure 5C:
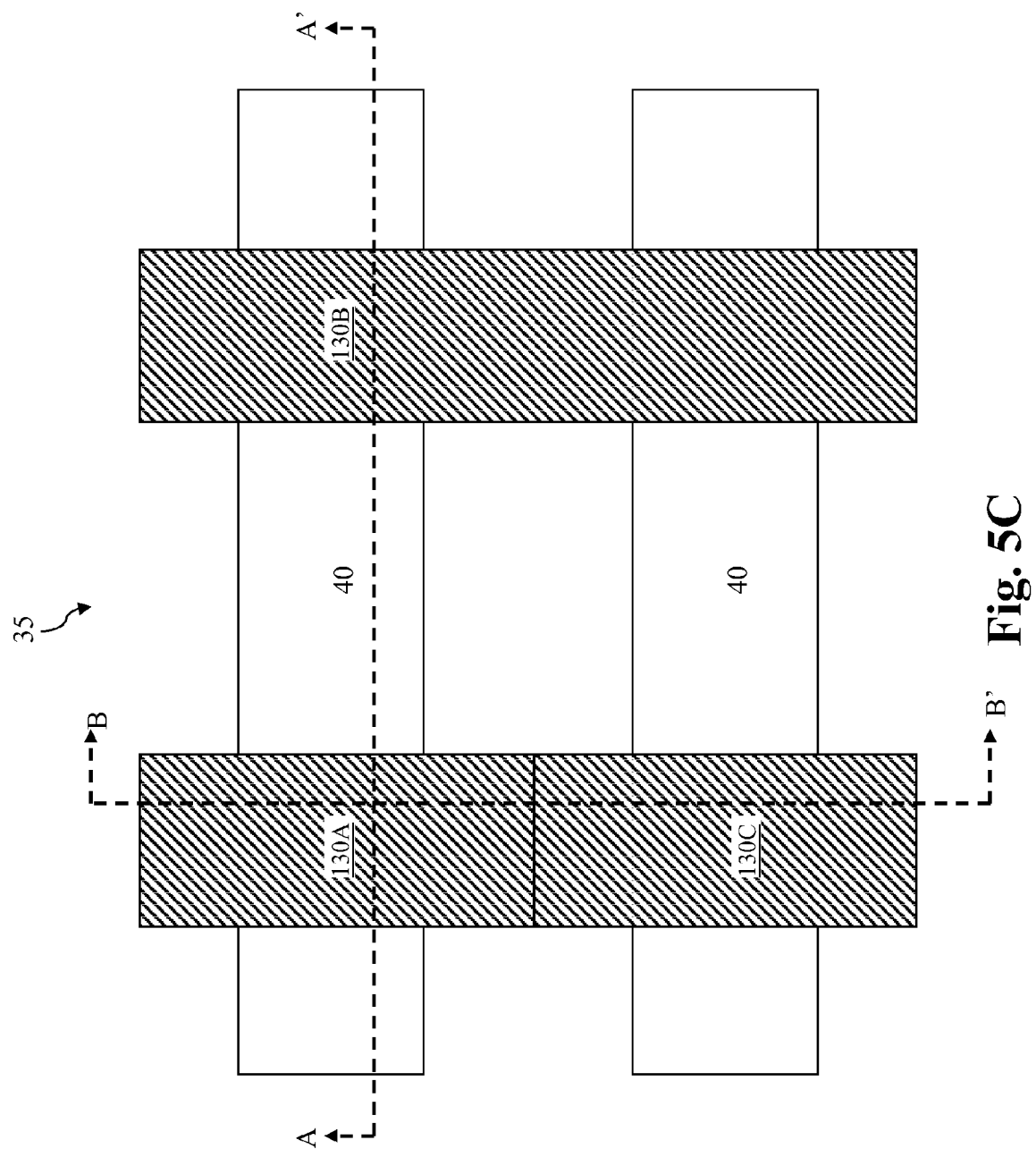

To provide more clarity and detail of the fabrication process, a diagrammatic fragmentary cross-sectional side view of the semiconductor device 35 taken in a different direction is shown in FIG. 5B, and a diagrammatic fragmentary top view of the semiconductor device 35 is shown in FIG. 5C. Specifically, the cross-sectional view of FIG. 5A is taken along the dashed lines A-A' of the top view of FIG. 5C, and the cross-sectional view of FIG. 5B is taken along the dashed lines B-B' of the top view of FIG. 5C. As is shown in FIGS. 5A and 5C, the gate electrodes 130A and 130B are NMOS and PMOS gate electrodes, respectively, where they are spaced apart from each other. As is shown in FIGS. 5B and 5C, the gate electrodes 130A and 130C are NMOS and PMOS gate electrodes, respectively, where they are bordering or abutting each other.

Figure 6A:
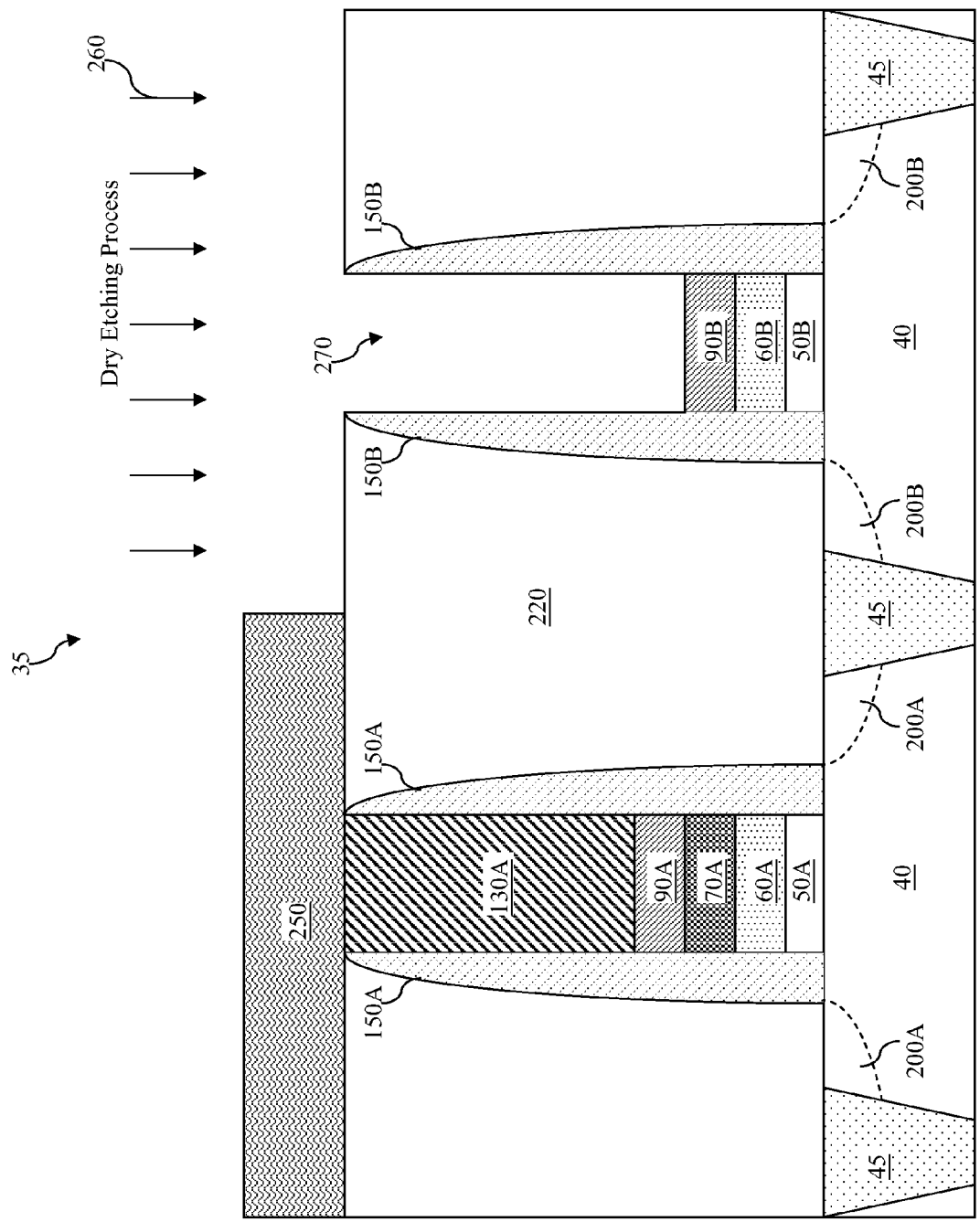
Figure 6B:
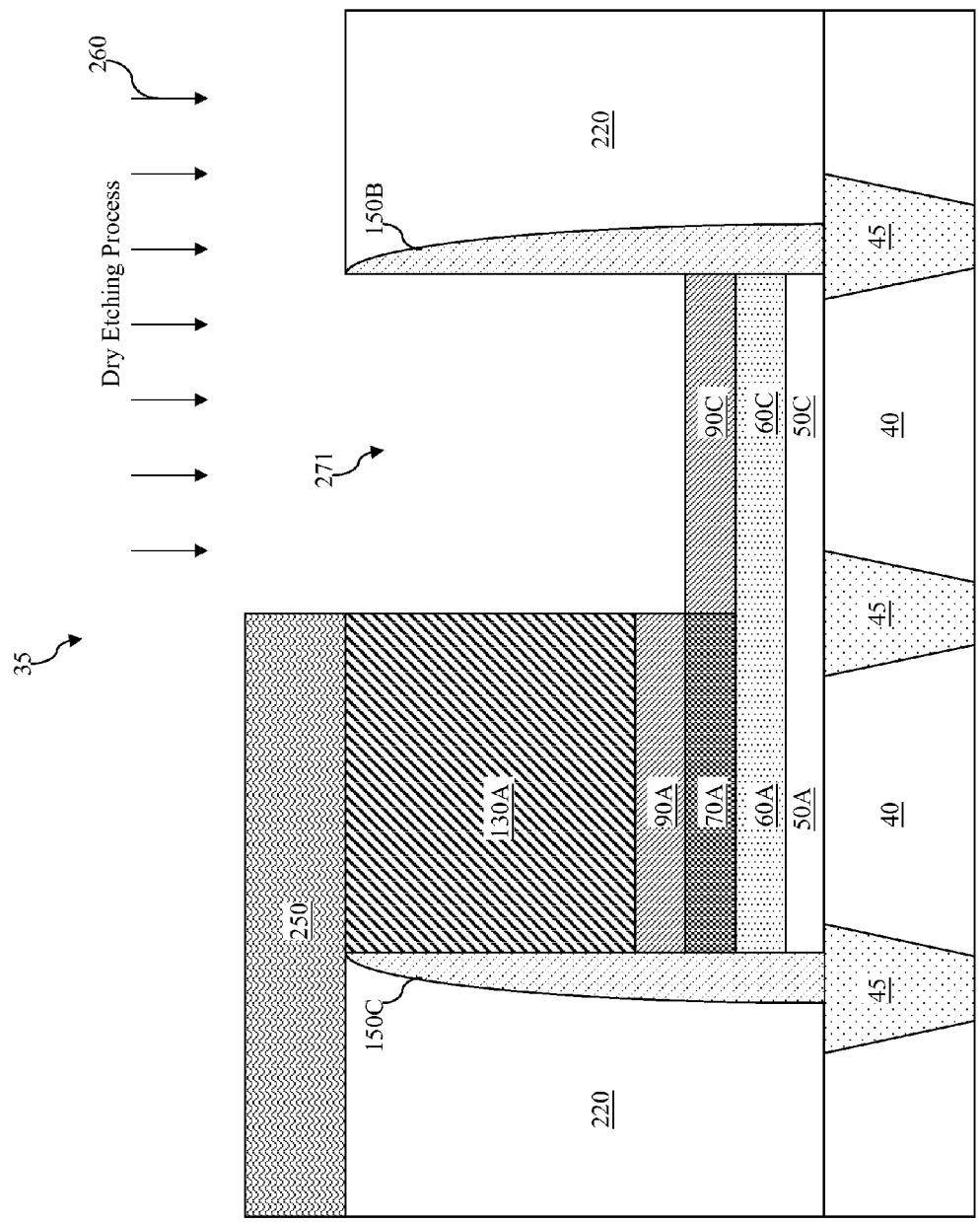

FIGS. 6A-9A and 6B-9B are also different cross-sectional side views (similar to the cross-sectional side views of FIGS. 5A-5B) corresponding to subsequent fabrication stages. The top views of these fabrication stages are not illustrated for the sake of simplicity, however. Referring now to FIGS. 6A-6B, a patterned photoresist mask 250 is formed over the NMOS transistor, so that the PMOS transistor is exposed. The formation of the patterned photoresist mask 250 may involve one or more spin coating, exposing, developing, baking, and rinsing processes (not necessarily in that order). Thereafter, a dry etching process 260 is performed to remove the PMOS dummy gate electrodes 130B and 130C, thereby forming openings or trenches 270 and 271. The capping layers 90B-90C serve as etching-stop layers for the etching process 260 so that the etching will stop when the capping layers 90B-90C are reached, and that the layers under the capping layers 90B-90C are protected (i.e., not etched) during the dry etching process 260. The photoresist mask 250 is subsequently removed using a stripping or ashing process.

Figure 7A:
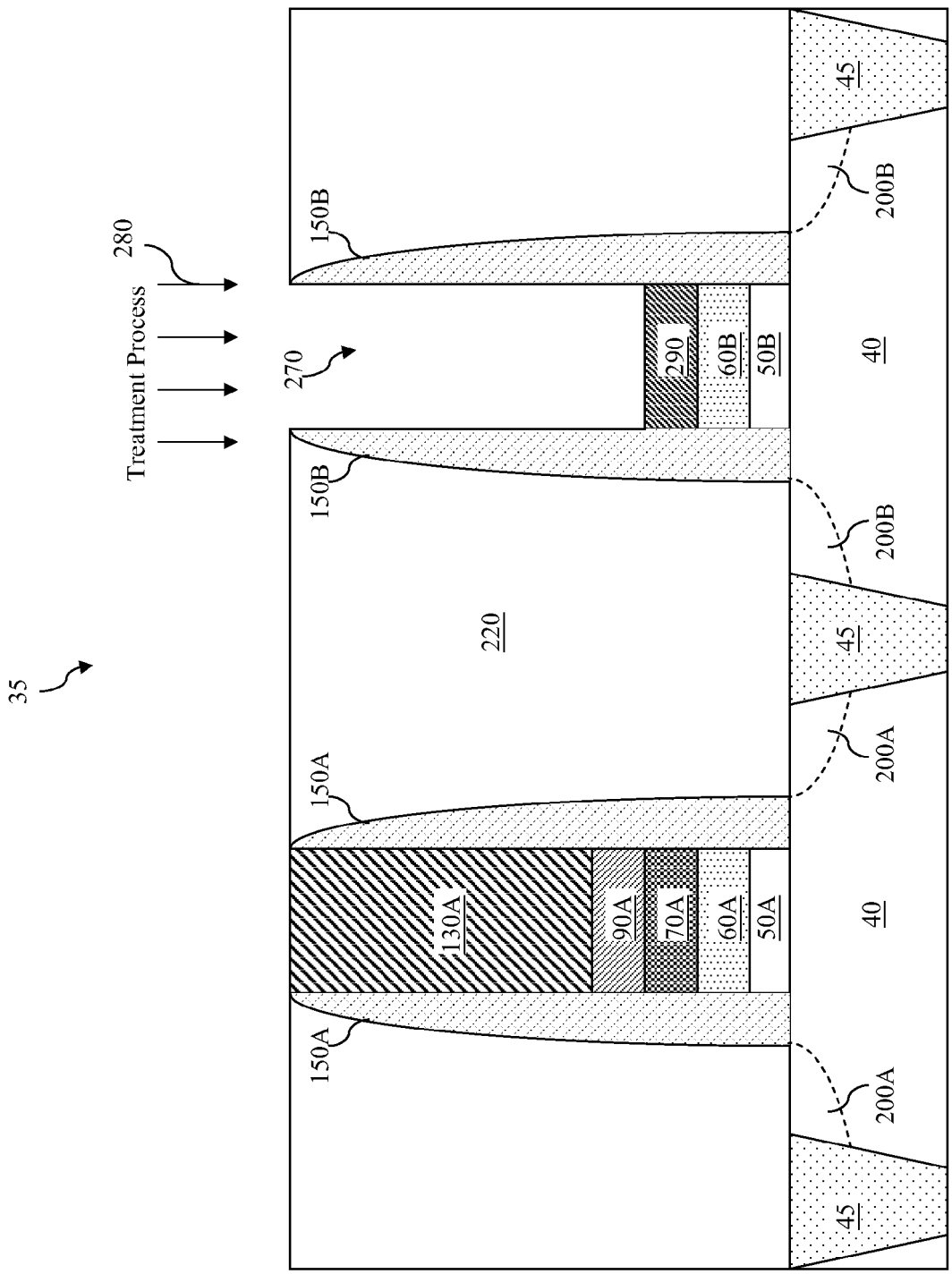
Figure 7B:
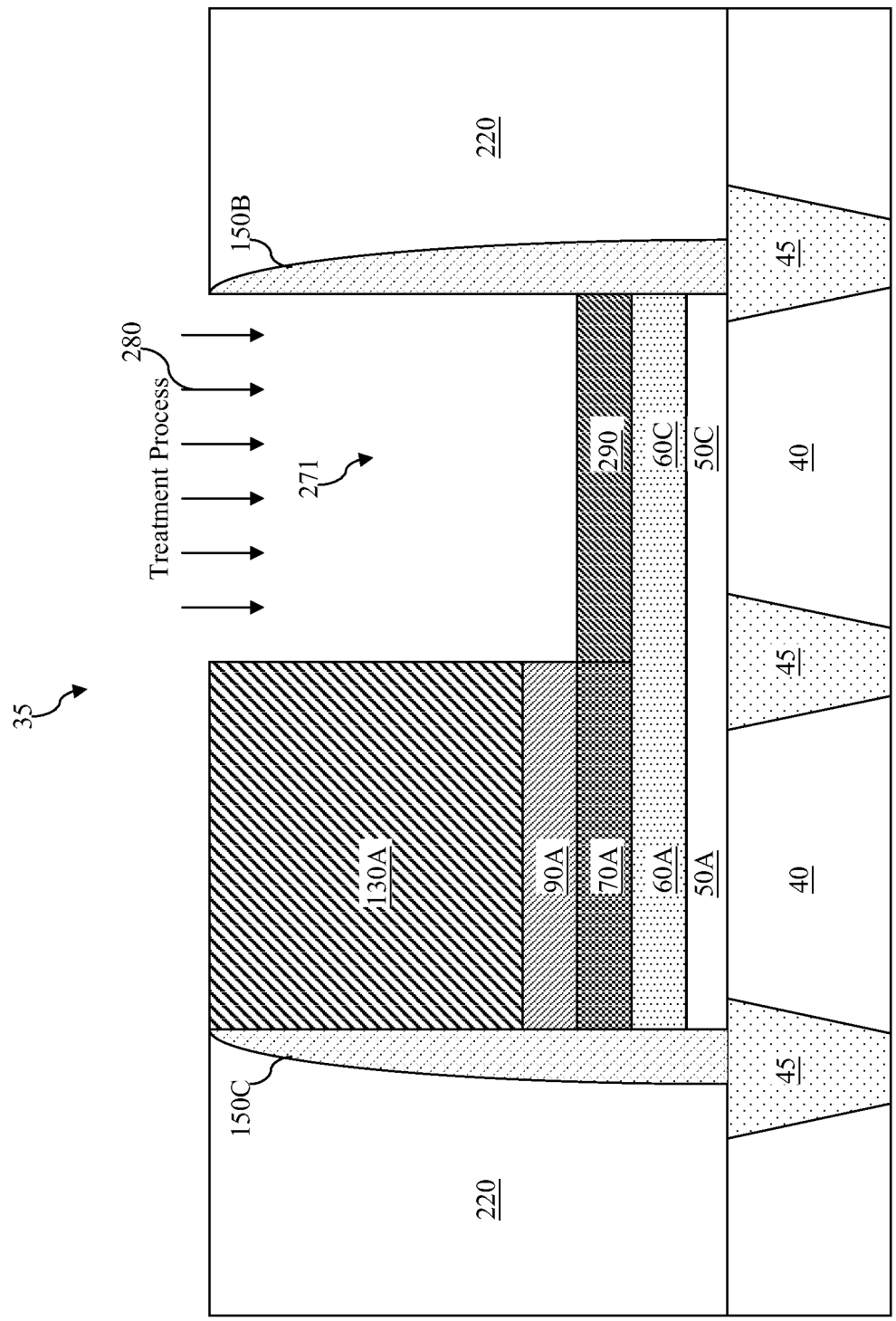

Referring to FIGS. 7A-7B, a treatment process 280 is performed to the capping layer 90B (in the PMOS transistor) to transform the capping layers 90B-90C (shown in FIGS. 6A-6B) into a work function layer 290. In some embodiments, the treatment process 280 includes an oxygen treatment process. Therefore, in embodiments where the capping layers 90B-90C contain TiN, the treatment process 280 transforms the TiN of the capping layer 90B into TiON of the work function layer 290. Since TiON is a P-type metal, the work function layer 290 is operable to tune the work function of the gate of the PMOS transistor to achieve a desired threshold voltage. The work function layer 290 also serves as an etching-stop layer for a later process. This oxygen treatment process 280 is performed under a source power of about 200 to 1000 W and a pressure of about 2 mTorr to about 5 mTorr, using a source gas comprising $O_2$, $O_3$, or $H_2O$.

Figure 8A:
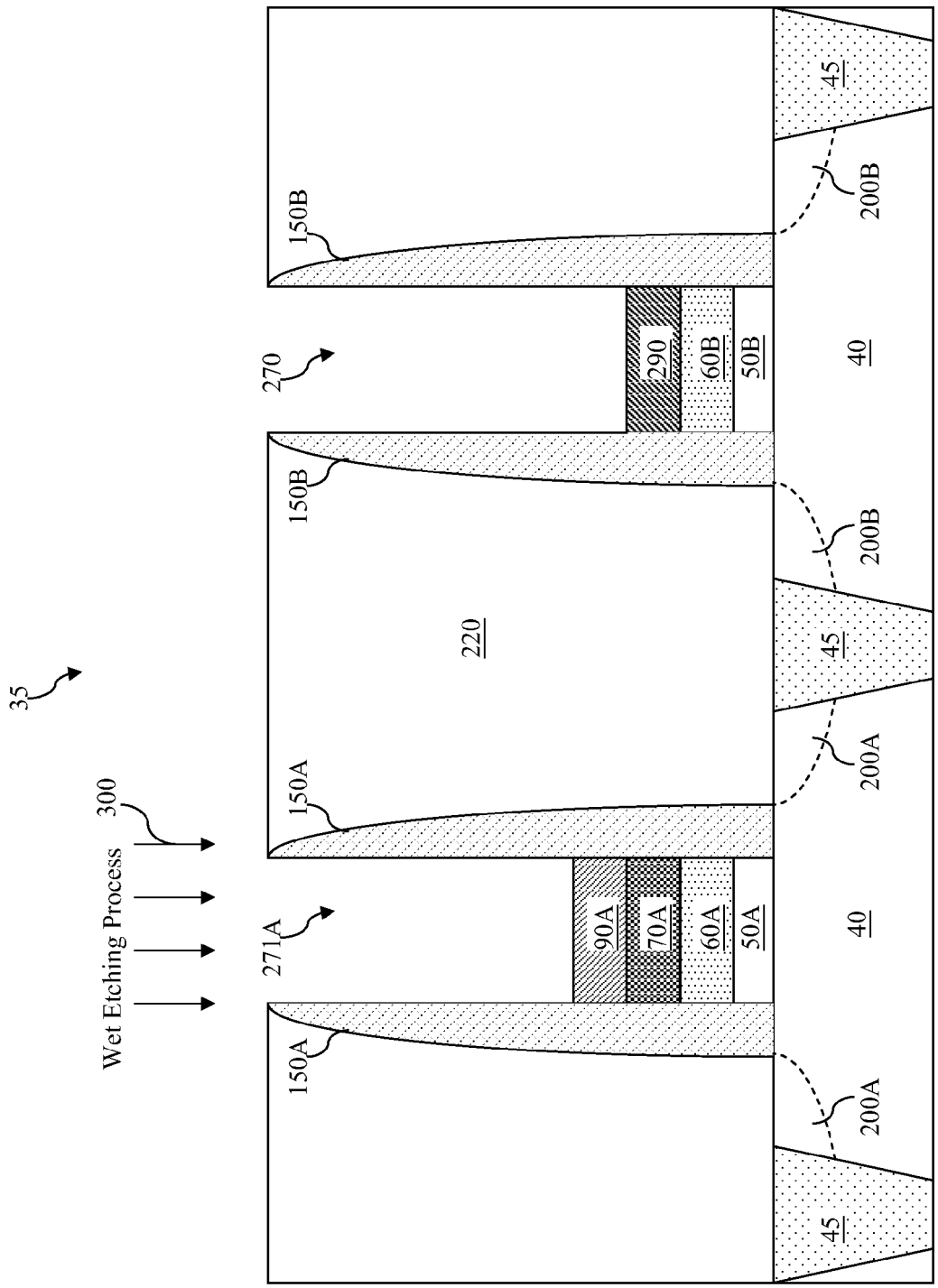
Figure 8B:
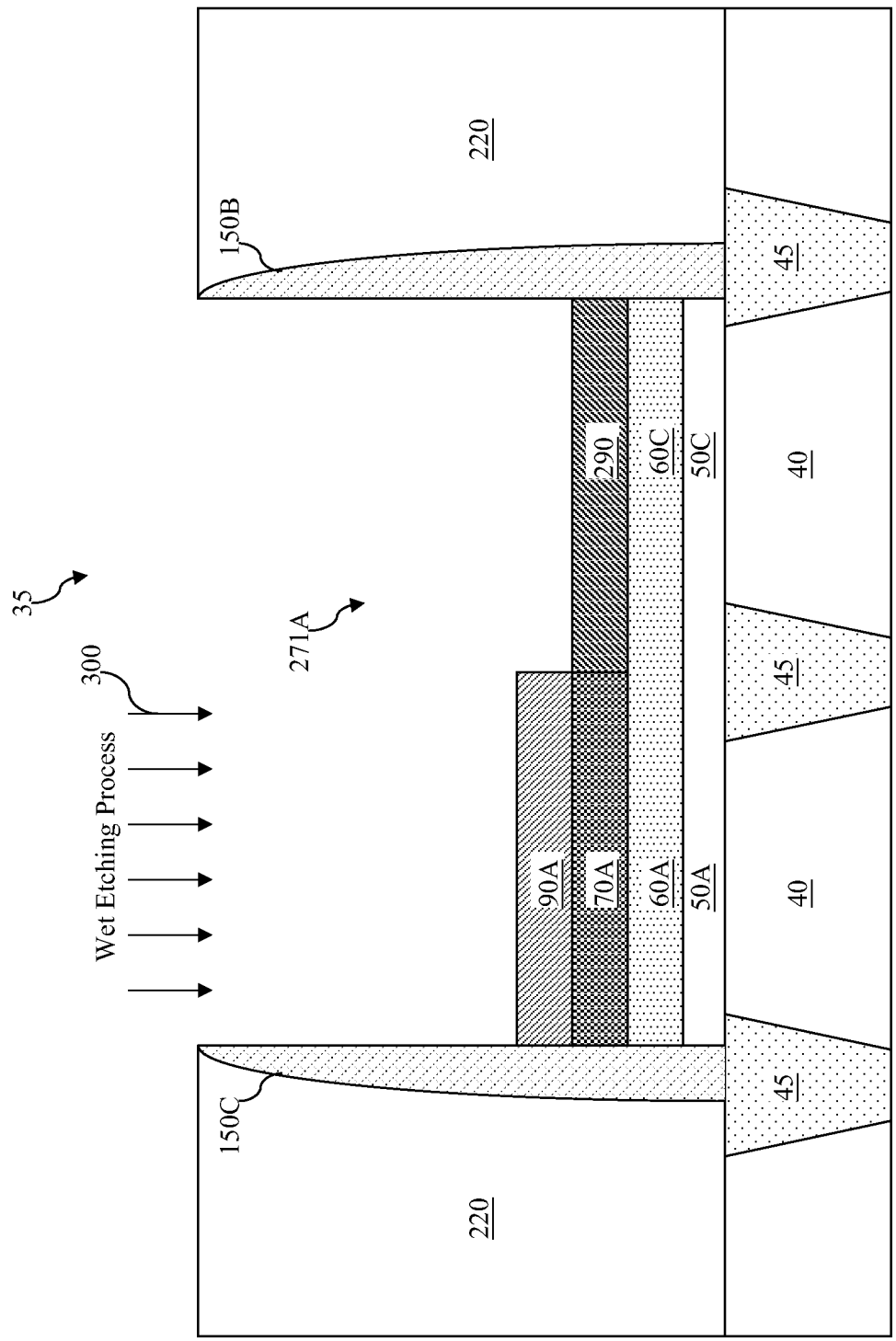

Referring to FIGS. 8A-8B, a wet etching process 300 is performed to remove the dummy gate electrode 130A of the NMOS transistor. The removal of the dummy gate electrode 130A transforms the opening 271 into an opening 271A that is bigger than before. In other words, the opening 271A now spans both an NMOS transistor and a PMOS transistor. The capping layer 90A and the work function layer 290 serve as etching-stop layers in the wet etching process 300. In other words, the TiN material of the capping layer 90A and the TiON material of the work function layer 290 each have a high etching selectivity with the polysilicon material of the dummy gate electrode 130A that is removed in the wet etching process 300. In some embodiments, the wet etching process 300 uses Tetramethylammonium Hydroxide (TMAH) as an etchant. No mask is necessary for the wet etching process 300.

At this stage of fabrication, the work function layer for both the NMOS transistor and the PMOS transistor have been formed. For the NMOS transistor, the capping layer 90A and the capping layer 70A work in conjunction to serve as a work function metal layer to tune the work function of the NMOS transistor, such that a desired threshold voltage may be achieved for the NMOS transistor. For the PMOS transistor, the work function layer 290 tunes the work function of the PMOS transistor, such that a desired threshold voltage may be achieved for the PMOS transistor.

Figure 9A:
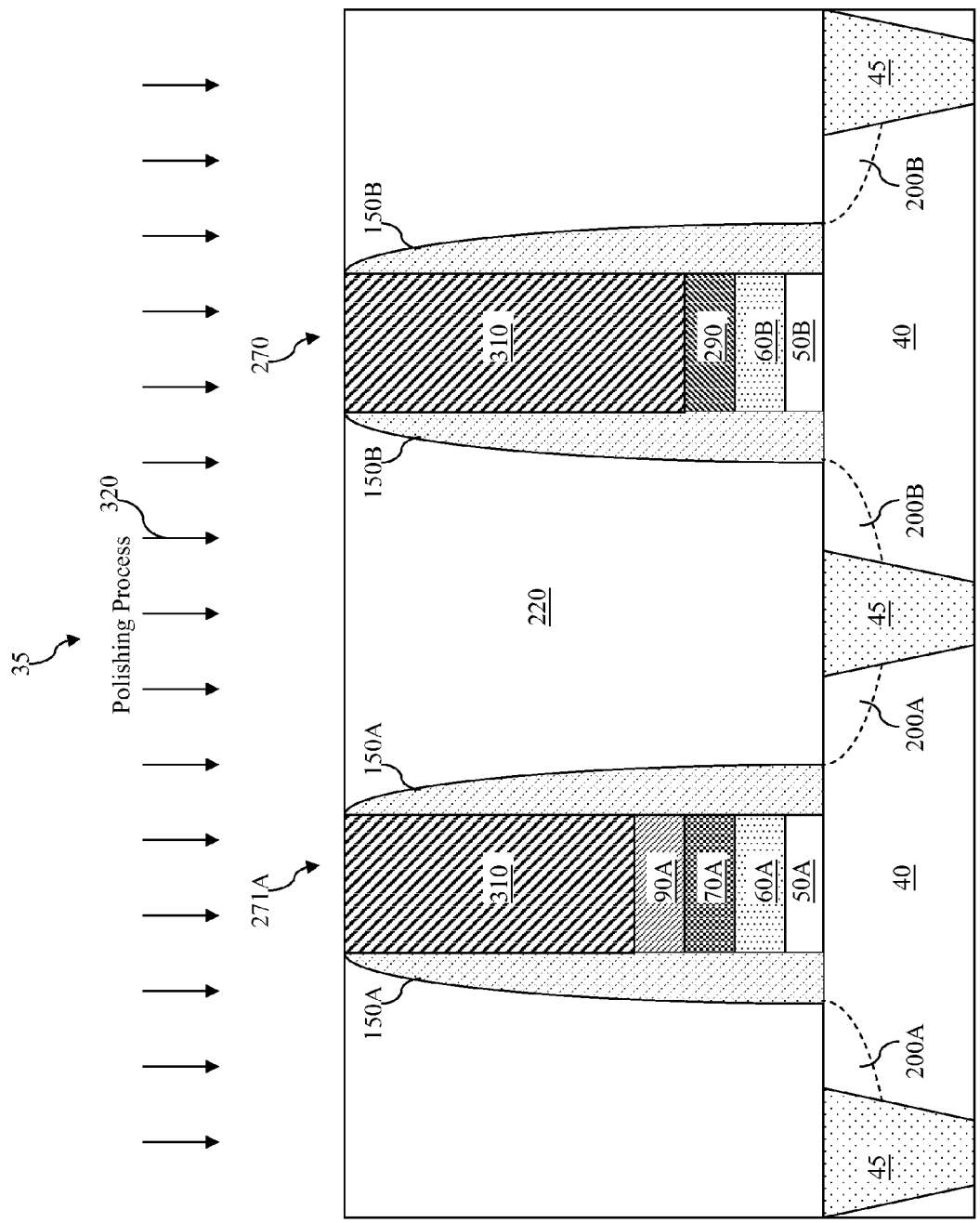
Figure 9B:
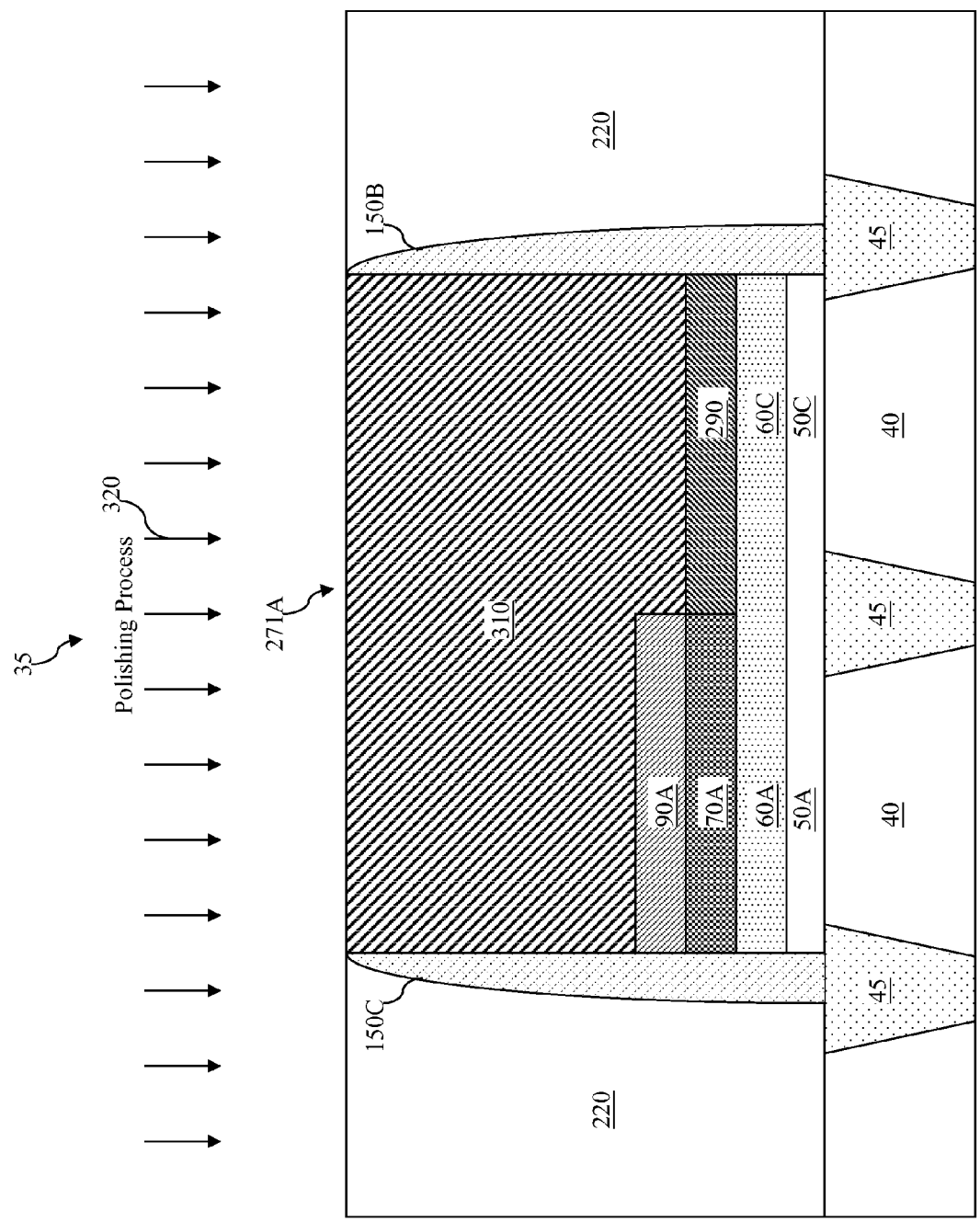

Referring now to FIGS. 9A-9B, the trenches 271A and 270 are each filled by a conductive material 310. The conductive material 310 may be formed by one or more deposition processes known in the art, for example, CVD, PVD, ALD, or combinations thereof. The conductive material 310 may include a blocking layer and a fill metal layer. The blocking layer is configured to block or reduce diffusion between the layer therebelow (e.g., the work function metal layer) and the layer thereabove (e.g., the fill metal layer). In some embodiments, the blocking layer includes TiN or TaN. The fill metal layer is configured to serve as the main conductive portion of the NMOS and PMOS gate electrodes, respectively. In some embodiments, the fill metal layer contains Aluminum (Al). The fill metal layer may alternatively include contain other conductive materials such as Tungsten (W), Copper (Cu), or combinations thereof. In other embodiments, a wetting layer (e.g., containing Ti) may be formed between the blocking layer and the fill metal layer. For the sake of simplicity, the blocking layer, the wetting layer, and the fill metal layer are not specifically illustrated herein.

It is understood that the work function of the NMOS and PMOS transistors are configured to their initial values based on the capping layers 90A-70A and 290, respectively. The thicknesses of these capping layers may dictate the work function values. However, in embodiments where further tuning of the work function values is desired, an additional work function metal layer may be formed over the capping layers 90A and 290 before the deposition of the conductive material 310. The additional work function metal layer may be an N-type work function metal, which may contain TiAl, TiAlN, TaC, TaCN, or TaSiN as examples. The additional work function metal layer may be a P-type work function metal, which may contain TiN, W, WN, or WAl as examples.

If an N-type work function additional metal layer is formed, the end effect is that the NMOS transistor is more N-type, and the PMOS transistor is less P-type (because the N-type additional work function metal layer "cancels out" the P-type properties of the capping layer 290). Conversely, if a P-type work function additional metal layer is formed, the end effect is that the PMOS transistor is more P-type, and the NMOS transistor is less N-type (because the P-type additional work function metal layer "cancels out" the N-type properties of the capping layers 90A and 70A). In this manner, the work function values of the NMOS and PMOS transistors can be further tuned.

A polishing process 320 is then performed to planarize the exposed surface of the conductive material 310. The polishing process 320 is performed until the exposed surface of the conductive material 310 is substantially coplanar with the exposed surfaces of the ILD layer 220. In some embodiments, the polishing process 320 includes a CMP process. Since the NMOS and PMOS transistors "share" the same fill metal layer, a single CMP process is sufficient to planarize the surface of the fill metal layer.

It is understood that additional processes may be performed to complete the fabrication of the semiconductor device 35. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein. It is also understood that some of the fabrication processes for the various embodiments discussed above may be combined depending on design needs and manufacturing requirements.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiment.

One advantage is that an extra dry etching process may be saved (i.e., no longer needed). In traditional gate replacement fabrication processes, the NMOS and PMOS dummy gate electrodes are removed separately. In other words, one dry etching process is used to remove the dummy gate electrode for the PMOS transistor, and a different dry etching process is used to remove the dummy gate electrode for the NMOS transistor. Each dry etching process may involve a plurality of process steps and may require the use of expensive fabrication tools. Therefore, it is desirable to reduce or eliminate the use of dry etching processes if possible. According to the embodiments of the present disclosure, only one dry etching process is used (to remove the dummy gate electrode for the PMOS transistor). A wet etching process is used to remove the dummy gate electrode for the NMOS transistor, whereas this step would have required a dry etching process in existing methods. Wet etching processes are simpler and cheaper than dry etching processes, thus the present disclosure allows for simpler and cheaper fabrication compared to conventional fabrication methods.

Another advantage is that the embodiments of the present disclosure entail a single polishing process to planarize the metal gate electrode surface, rather than two separate polishing processes as in conventional fabrication. As discussed above, the existing metal gate fabrication methods form the metal gates separately. In more detail, after the PMOS dummy gate electrode is removed, a plurality of deposition processes are performed to form a PMOS work function metal component and a fill metal component as the PMOS metal gate electrode in place of the PMOS dummy gate electrode. A polishing process such as a CMP process is then performed to planarize the PMOS metal gate electrode surface. When this is complete, similar procedures are performed to form an NMOS metal gate electrode in place of the NMOS dummy gate electrode, and another polishing process is then performed to planarize the NMOS metal gate electrode surface. Therefore, two separate polishing processes are needed for existing metal gate fabrication methods: one to polish the PMOS metal gate, and another to polish the NMOS metal gate.

In comparison, according to the embodiments of the present disclosure, the metal gate electrodes (the fill metal portions) for the PMOS and NMOS transistors are formed in the same process. A single polishing process is performed to planarize the surfaces for both the NMOS and PMOS metal gate electrodes. Consequently, an extra polishing process can be eliminated, further reducing fabrication costs and shortening process time. Furthermore, since the NMOS and PMOS transistors "share" the same portions of the metal gate electrode (other than the work function metal layers) and "share" the same polishing process, process uniformity is enhanced. For example, gate height discrepancies between the PMOS and NMOS transistors (due to different polishing processes) will be significantly reduced or eliminated.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate;
an NMOS gate disposed over the substrate, wherein the NMOS gate includes: a high-k gate dielectric, a first capping layer disposed over the high-k gate dielectric, and a second capping layer disposed over the first capping layer, and wherein the first and second capping layers are configured to collectively tune a work function of the NMOS gate, wherein the second capping layer includes a bottom surface facing the substrate and a top surface facing away from the substrate such that a sidewall surface of the second capping layer extends from the bottom surface to the top surface of the second capping layer, wherein the first capping layer includes a bottom surface facing the substrate and a top surface facing away from the substrate such that a sidewall surface of the first capping layer extends from the bottom surface to the top surface of the first capping layer; and
a PMOS gate disposed over the substrate, wherein the PMOS gate includes: a high-k gate dielectric, a third capping layer disposed over the high-k gate dielectric, and a first metal gate electrode disposed over the third capping layer, and wherein the third capping layer is configured to tune a work function of the PMOS gate, wherein the PMOS gate is free of the second capping layer, wherein the third capping layer of the PMOS gate physically contacts the first capping layer of the NMOS gate, wherein the first metal gate electrode of the PMOS gate physically cantacts the sidewall surface of the second capping layer of the NMOS gate, wherein the third capping layer of the PMOS gate physically contacts the entire sidewall surface of the first capping layer of the NMOS gate.

2. The semiconductor device of claim 1, wherein the third capping layer is an oxidized version of the second capping layer.

3. The semiconductor device of claim 2, wherein:
the second capping layer includes titanium nitride; and
the third capping layer includes titanium oxynitride.

4. The semiconductor device of claim 1, wherein the first capping layer includes lanthanum oxide.

5. The semiconductor device of claim 1, wherein the high-k gate dielectric has a dielectric constant greater than that of silicon dioxide.

6. The semiconductor device of claim 1, wherein the NMOS gate includes a second metal gate electrode.

7. The semiconductor device of claim 6, wherein the second metal gate electrode includes a work function metal layer.

8. A semiconductor structure, comprising:
an nFET transistor and a pFET transistor formed over a substrate, wherein:
the nFET transistor includes:
a high-k gate dielectric layer; and
an nFET work function layer formed over the high-k gate dielectric layer, the nFET work function layer including a metal oxide component and a metal nitride component, wherein the metal nitride component includes a bottom surface facing the substrate and a top surface facing away from the substrate such that a sidewall surface of the metal nitride component extends from the bottom surface to the top surface of the metal nitride component, wherein the metal oxide component includes a bottom surface facing the substrate and a top surface facing away from the substrate such that a sidewall surface of the metal oxide component extends from the bottom surface to the top surface of the metal oxide somponent; and
the pFET transistor includes:
a high-k gate dielectric layer; and
an pFET work function layer formed over the high-k gate dielectric layer, the pFET work function layer including a metal oxynitride component and a first metal gate electrode disposed over the metal oxynitride component, and
wherein the pFET transistor is free of the metal nitride component, wherein the metal oxynitride component of the pFET transistor physically contacts the metal oxide component of the nFET transistor, wherein the first metal gate electrode of the pFET transistor physically contacts the sidewall surface of the metal nitride component of the nFET transistor, wherein the metal oxynitride component of the pFET transistor physically contacts the entire sidewall surface of the metal oxide component of the nFET transistor.

9. The semiconductor structure of claim 8, wherein the metal oxide component contains lanthanum oxide.

10. The semiconductor structure of claim 8, wherein the metal nitride component includes titanium nitride.

11. The semiconductor structure of claim 8, wherein the metal oxynitride component includes titanium oxynitride.

12. The semiconductor structure of claim 8, wherein:
the high-k gate dielectric layer has a dielectric constant greater than that of silicon dioxide; and
the nFET transistor includes a second metal gate electrode formed over the nFET work function layer.

13. The semiconductor structure of claim 12, wherein the second metal gate electrode of the nFET transistor includes an additional work functional metal layer formed over the nFET work function layer.

14. A device comprising:
a first transistor of a first conductivity type disposed over a substrate, wherein the first transistor includes a high-k dielectric layer, a first capping layer disposed over the high-k dielectric layer, a second capping layer disposed over the first capping layer, and a metal layer disposed over the second capping layer, wherein the second capping layer includes a bottom surface facing the substrate and a top surface facing away from the substrate such that a sidewall surface of the second capping layer extends from the bottom surface to the top surface of the second capping layer, wherein the fist capping layer includes a bottom surface facing the substrate and a top surface facing away from the substrate such that a sidewall surface of the first capping layer extends from the bottom surface to the top surface of the first capping layer; and
a second transistor of a second sonductivity type disposed over the substrate, wherein the second conductivity type is opposite the first conductivity, wherein the second transistor includes the high-k dielectric layer, a third capping layer disposed over the high-k dielectric layer, and the metal layer disposed over the third capping layer, and wherein the second transistor is free of the first and second capping layers, wherein the third capping layer of the second transistor physically contacts the first capping layer of the first transistor, wherein the metal layer of the second transistor physically cantacts the sidewall surface of the second capping layer of the first transistor, wherein the third capping layer of the second transistor physically contacts the entire sidewall surface of the first capping layer of the first transistor.

15. The device of claim 14, wherein the first capping layer includes lanthanum,
wherein the second capping layer includes titanium nitride, and
wherein the third capping layer includes titanium oxynitride.

16. The device of claim 14, wherein the first capping layer is different than the second capping layer, and
wherein the third capping layer is different than the second capping layer.

17. The device of claim 14, wherein a top surface of the metal layer of the second transistor os substantially coplanar with a top surface of the metal layer of the first transistor.

18. The device of claim 14, wherein the first capping layer includes a metal oxide,
wherein the second capping layer includes a metal nitride, and
wherein the third capping layer includes a metal oxynitride.

19. The device of claim 14, wherein the first conductivity type is n-type and the second conductivity type is p-type.

20. The device of claim 14, wherein the sidewall surface is completely covered by the metal layer of the second transistor.

\* \* \* \* \*